(12) United States Patent
Su et al.

(10) Patent No.: US 11,723,261 B2
(45) Date of Patent: Aug. 8, 2023

(54) LIGHT-EMITTING COMPONENT, MANUFACTURING METHOD THEREFOR, MASK, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Bejing (CN)

(72) Inventors: Tongshang Su, Beijing (CN); Dongfang Wang, Beijing (CN); Jun Liu, Beijing (CN); Yingbin Hu, Beijing (CN); Qinghe Wang, Beijing (CN); Shengping Du, Beijing (CN); Liangchen Yan, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/271,637

(22) PCT Filed: May 14, 2020

(86) PCT No.: PCT/CN2020/090148
§ 371 (c)(1),
(2) Date: Feb. 26, 2021

(87) PCT Pub. No.: WO2020/233485
PCT Pub. Date: Nov. 26, 2020

(65) Prior Publication Data
US 2021/0184126 A1    Jun. 17, 2021

(30) Foreign Application Priority Data
May 21, 2019  (CN) .......................... 201910425411.8

(51) Int. Cl.
*H10K 71/16*    (2023.01)
*H10K 50/824*   (2023.01)
(Continued)

(52) U.S. Cl.
CPC ........... *H10K 71/166* (2023.02); *H10K 50/11* (2023.02); *H10K 50/824* (2023.02); *H10K 71/621* (2023.02)

(58) Field of Classification Search
CPC combination set(s) only.
See application file for complete search history.

(56) References Cited

U.S. PATENT DOCUMENTS

2011/0266535 A1   11/2011   Li et al.
2015/0021560 A1*  1/2015   Jeong .................. H01L 51/5228
                                                          438/34

(Continued)

FOREIGN PATENT DOCUMENTS

CN    103882374 A    6/2014
CN    104659063 A    5/2015

(Continued)

OTHER PUBLICATIONS

First office action of Chinese application No. 201910425411.8 dated Oct. 29, 2020.

(Continued)

*Primary Examiner* — Daniel Whalen
(74) *Attorney, Agent, or Firm* — Lippes Mathias LLP

(57) ABSTRACT

A method for manufacturing a light-emitting component, including forming an auxiliary electrode and a first electrode arranged at an interval on a base substrate; depositing, by means of a mask with a hollow area, a light-emitting layer on the base substrate on which the auxiliary electrode and the first electrode are formed; and forming a second electrode on the base substrate on which the light-emitting layer (Continued)

is formed. The light-emitting layer covers at least part of the first electrode, and at least a partial area of the auxiliary electrode is exposed outside the light-emitting layer. The second electrode covers at least part of the light-emitting layer and the at least partial area of the auxiliary electrode, and the second electrode is connected to the at least partial area of the auxiliary electrode.

17 Claims, 5 Drawing Sheets

(51) Int. Cl.
*H10K 50/11* (2023.01)
*H10K 71/00* (2023.01)

(56) References Cited

U.S. PATENT DOCUMENTS

| | | | |
|---|---|---|---|
| 2016/0254452 | A1 | 9/2016 | Zhao et al. |
| 2016/0365532 | A1* | 12/2016 | Song .................. H01L 27/3246 |
| 2017/0373132 | A1* | 12/2017 | Choung .............. H01L 27/3218 |
| 2019/0081240 | A1 | 3/2019 | Wei et al. |
| 2019/0326376 | A1 | 10/2019 | Huo |
| 2021/0184126 | A1 | 6/2021 | Su et al. |
| 2021/0210589 | A1 | 7/2021 | Zou et al. |

FOREIGN PATENT DOCUMENTS

| | | |
|---|---|---|
| CN | 107604306 A | 1/2018 |
| CN | 108878673 A | 11/2018 |
| CN | 109713162 A | 5/2019 |
| CN | 110148615 A | 8/2019 |

OTHER PUBLICATIONS

Second office action of Chinese application No. 201910425411.8 dated Apr. 1, 2021.

* cited by examiner

LIGHT-EMITTING COMPONENT, MANUFACTURING METHOD THEREFOR, MASK, AND DISPLAY DEVICE

CROSS-REFERENCE TO RELATED APPLICATION

The present disclosure is a 371 of PCT Application No. PCT/CN2020/090148, filed on May 14, 2020, which claims priority to Chinese Patent Application No. 201910425411.8, filed on May 21, 2019 and titled "LIGHT-EMITTING COMPONENT AND MANUFACTURING METHOD THEREOF, MASK, DISPLAY SUBSTRATE AND DISPLAY DEVICE", which is incorporated herein by reference in its entirety.

TECHNICAL FIELD

The present disclosure relates to a light-emitting component and a manufacturing method thereof, a mask and a display device.

BACKGROUND

Organic Light-Emitting Diode (OLED) display devices are widely used because of their better display effects.

In the related art, an OLED display device includes a light-emitting component, and the light-emitting component includes a base substrate, as well as an auxiliary electrode and an OLED located on the base substrate. The auxiliary electrode is connected to the cathode of the OLED.

SUMMARY

In an aspect, a method for manufacturing a light-emitting component is provided. The method includes:

forming an auxiliary electrode and a first electrode arranged at an interval on a base substrate;

depositing, by means of a mask with a hollow area, a light-emitting layer on the base substrate on which the auxiliary electrode and the first electrode are formed, wherein the light-emitting layer covers at least part of the first electrode, and at least a partial area of the auxiliary electrode is exposed outside the light-emitting layer; and forming a second electrode on the base substrate on which the light-emitting layer is formed, wherein the second electrode covers at least part of the light-emitting layer and the at least partial area of the auxiliary electrode, and is connected to the at least partial area of the auxiliary electrode.

In another aspect, a light-emitting component is provided. The light-emitting component is manufactured by any method for manufacturing a light-emitting component and includes a base substrate, an auxiliary electrode, a first electrode, a light-emitting layer and a second electrode; wherein the first electrode and the auxiliary electrode are arranged at an interval on the base substrate;

the light-emitting layer is located on a side of the auxiliary electrode away from the base substrate and covers at least part of the first electrode, and at least a partial area of the auxiliary electrode is exposed outside the light-emitting layer; and the second electrode is located on a side of the light-emitting layer away from the base substrate, covers at least part of the light-emitting layer and the at least partial area of the auxiliary electrode, and is connected to the at least partial area of the auxiliary electrode.

In still another aspect, a display device is provided. The display device includes any one of the light-emitting components provided in the present disclosure.

DETAILED DESCRIPTION

To make the principles and technical solutions of the present disclosure clearer, the embodiments of the present disclosure will be described below in detail in conjunction with the accompanying drawings.

Figure 1:
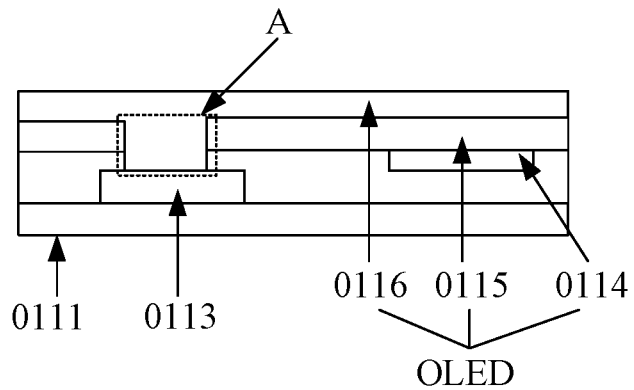
FIG. 1 is a schematic structural diagram of an OLED display device in the related art.

FIG. 1 is a schematic structural diagram of a light-emitting component in an OLED display device in the related art. As shown in FIG. 1, the light-emitting component 011 includes a base substrate 0111, as well as an auxiliary electrode 0113 and an OLED which are located on the base substrate 0111. The OLED includes an anode 0114, a light-emitting layer 0115 and a cathode 0116 which are sequentially arranged in a direction away from the base substrate 0111. The cathode 0116 is electrically connected to the auxiliary electrode 0113 through a via hole A in the light-emitting layer 0115.

During manufacture of the light-emitting component 011, the auxiliary electrode 0113, the anode 0114 and the light-emitting layer 0115 needs to be formed on the base substrate 0111 first. Then, the via hole A is formed in the light-emitting layer 0115 using laser to make the auxiliary electrode 0113 be exposed through the via hole A, and finally, the cathode 0114 is formed so that the cathode 0114 is electrically connected to the auxiliary electrode 0113 through the via hole A.

However, as the light-emitting layer 0115 is usually made from an organic material, when the light-emitting layer 0115 is irradiated by laser to form the via hole A, impurity particles are formed and adhered to the light-emitting layer 0115, which adversely affects the light-emitting effect of the light-emitting component. In addition, the efficiency of forming the via hole with laser is low, and thus the efficiency of manufacturing the light-emitting component is low. An embodiment of the present disclosure provides a method for manufacturing a light-emitting component. When the method is adopted to manufacture the light-emitting component, the light-emitting effect of the light-emitting component will not be adversely affected, and the manufacturing efficiency is high.

Figure 2:
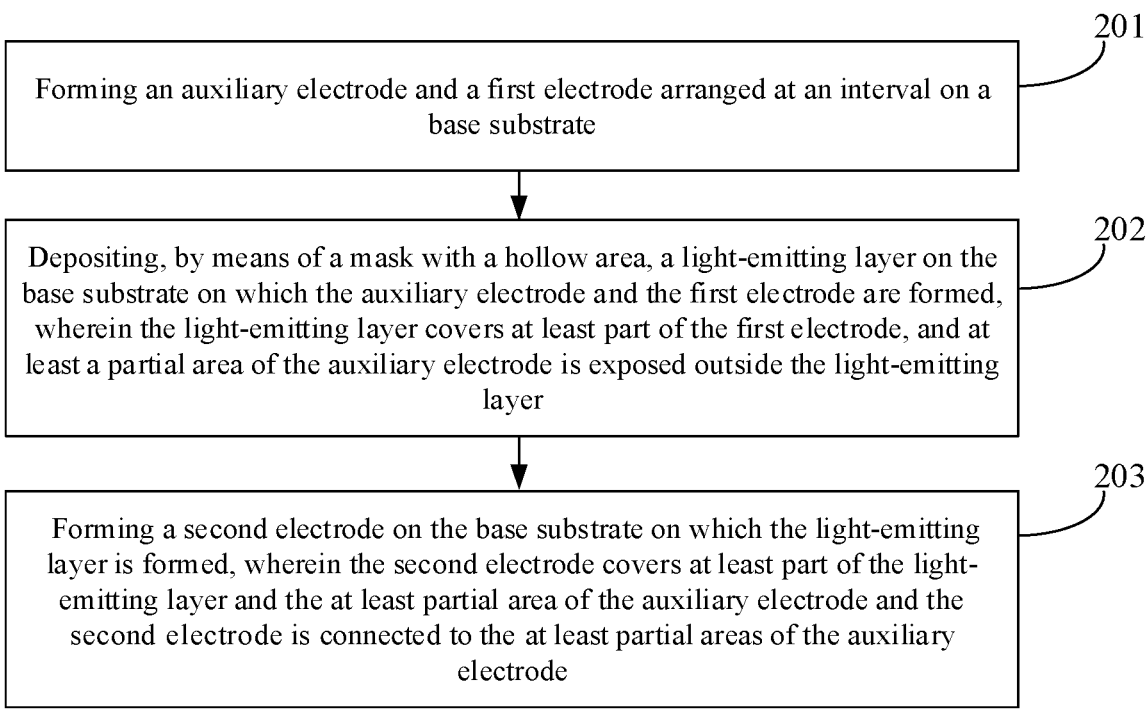
FIG. 2 is a flow chart of a method of manufacturing a light-emitting component according to an embodiment of the present disclosure.

For example, FIG. 2 is a flow chart of a method of manufacturing a light-emitting component according to an embodiment of the present disclosure. As shown in FIG. 2, the method for manufacturing the light-emitting component may include the following steps.

In step 201, an auxiliary electrode and a first electrode arranged at an interval are formed on a base substrate.

In step 202, a light-emitting layer is deposited, by means of a mask with a hollow area, on the base substrate on which the auxiliary electrode and the first electrode are formed. The light-emitting layer covers at least part of the first electrode, and at least a partial area of the auxiliary electrode is exposed outside the light-emitting layer.

In step 203, a second electrode is formed on the base substrate on which the light-emitting layer is formed. The second electrode covers at least part of the light-emitting layer and the at least partial area of the auxiliary electrode, and is connected to the at least partial area of the auxiliary electrode.

In the light-emitting component manufactured by the method provided in the embodiment of the present disclosure, the light-emitting layer can emit light under the action of voltages on the first electrode and the second electrode. In addition, the second electrode is connected to the auxiliary electrode. Therefore, the auxiliary electrode can reduce the impedance of the second electrode, thereby reducing the power consumption of the entire light-emitting component.

In summary, in the method for manufacturing the light-emitting component provided in the embodiment of the present disclosure, after the auxiliary electrode and the first electrode are formed on the base substrate, the light-emitting layer is deposited by using the mask and the light-emitting layer does not cover the at least partial area of the auxiliary electrode. Afterwards, the second electrode is formed, to directly cover the at least partial area of the auxiliary electrode and at least part of the light-emitting layer, so that the second electrode is electrically connected to the auxiliary electrode. Since laser is not used in the method, no impurity particles will be adhered to the light-emitting layer, and the light-emitting effect of the light-emitting component will not be adversely affected by the impurity particles.

In addition, the efficiency of forming the light-emitting layer by using the mask is relatively high. Therefore, the efficiency of manufacturing the light-emitting component in the embodiment of the present disclosure is higher than that in the related art.

Figure 3:
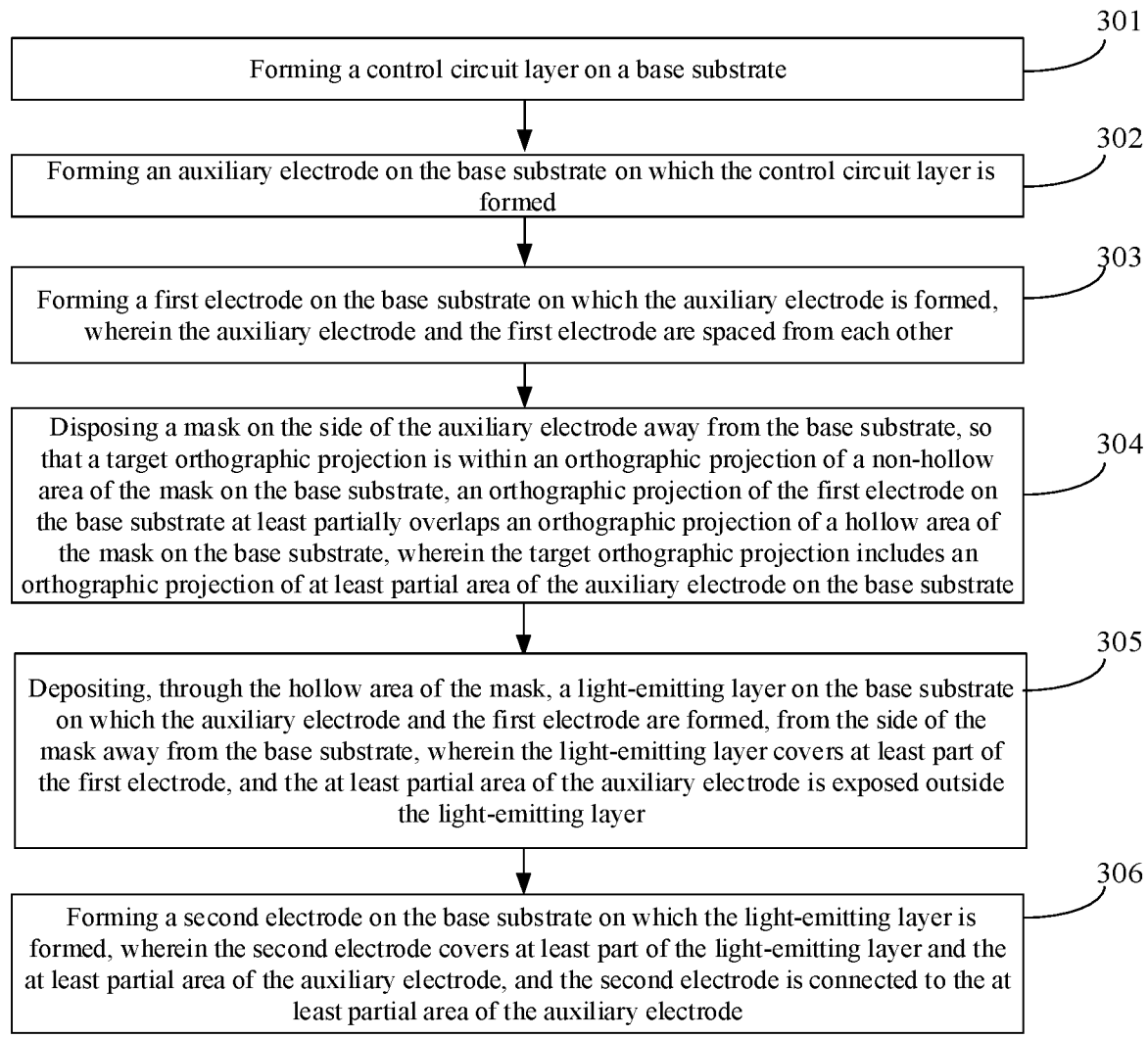
FIG. 3 is a flow chart of another method of manufacturing a light-emitting component according to an embodiment of the present disclosure.

For example, FIG. 3 is a flow chart of another method of manufacturing a light-emitting component according to an embodiment of the present disclosure. As shown in FIG. 3, the method of manufacturing the light-emitting component may include the following steps.

In step 301, a control circuit layer is formed on a base substrate.

Figure 4:
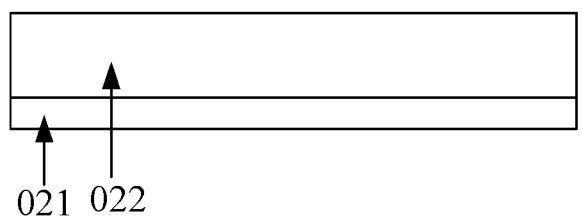
FIG. 4 is a schematic diagram showing a manufacturing process of a light-emitting component according to an embodiment of the present disclosure.

The control circuit layer may include a plurality of insulating layers and a plurality of conductor layers. The plurality of insulating layers and the plurality of conductor layers may form at least one thin film transistor (or at least one thin film transistor and at least one capacitor). After step 301, the structure shown in FIG. 4 can be obtained. The structure includes a base substrate 021 and a control circuit layer 022 located on the base substrate 021.

In step 302, an auxiliary electrode is formed on the base substrate on which the control circuit layer is formed.

In step 302, a layer of conductive material may be formed, by means of coating, Physical Vapor Deposition (PVD), Chemical Vapor Deposition (CVD) or the like, on the base substrate on which the control circuit layer is formed, to obtain a conductive material layer. PVD includes such physical deposition methods as magnetron sputtering, thermal evaporation, or the like, and CVD includes such chemical deposition methods as Plasma Enhanced Chemical Vapor Deposition (PECVD), or the like.

Figure 5:
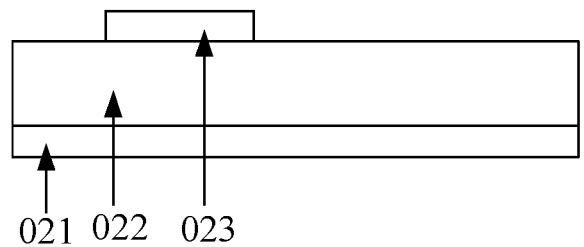
FIG. 5 is a schematic diagram showing a manufacturing process of a light-emitting component according to an embodiment of the present disclosure.

After the conductive material layer is obtained, the conductive material layer may be processed by a one-time patterning process to obtain the auxiliary electrode 023 as shown in FIG. 5. The one-time patterning process includes photoresist coating, exposure, development, etching and photoresist stripping. Processing the conductive material layer by the one-time patterning process includes: coating the conductive material layer with a layer of photoresist; then, exposing the photoresist by using a mask so that the an exposed area and a non-exposed area are formed on photoresist; processing by a development process, so that the photoresist in one of the exposed area and the non-exposed area is removed while the photoresist in the other area remains; after that, etching the area of the conductive material layer that is not covered with the photoresist; and after completion of etching, stripping the photoresist on the conductive material layer to obtain the auxiliary electrode.

It should be noted that the photoresist may be a positive photoresist or a negative photoresist. If the photoresist is a positive photoresist, after the development process, the photoresist in the exposed area is removed while the photoresist in the non-exposed area remains. If the photoresist is a negative photoresist, after the development process, the photoresist in the non-exposed area is removed while the photoresist in the exposed area remains.

In step 303, a first electrode is formed on the base substrate on which the auxiliary electrode is formed, wherein the auxiliary electrode is spaced from the first electrode.

Figure 6:
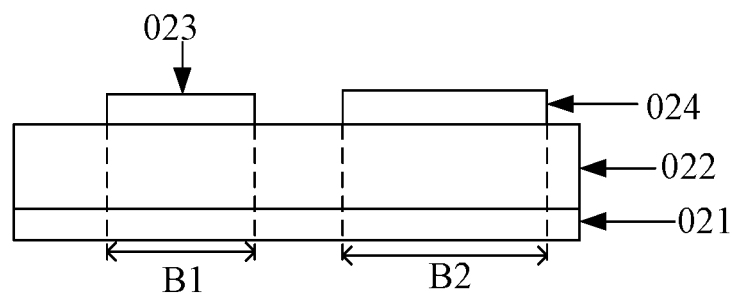
FIG. 6 is a schematic diagram showing a manufacturing process of a light-emitting component according to an embodiment of the present disclosure.

After the auxiliary electrode is formed, a layer of conductive material may be formed, by means of coating, PVD, CVD or the like, on the base substrate on which the auxiliary electrode is formed to obtain a conductive material layer. After the conductive material layer is obtained, the conductive material layer may be processed by a one-time patterning process to obtain the first electrode 024 as shown in FIG. 6. Besides, the first electrode 024 is electrically connected to the control circuit layer 022.

Both the auxiliary electrode 023 and the first electrode 024 may be located on the surface of the control circuit layer 022 away from the base substrate, and the auxiliary electrode and the first electrode are arranged at an interval. As shown in FIG. 6, a first orthographic projection B1 of the auxiliary electrode 023 on the base substrate 021 is located outside a second orthographic projection B2 of the first electrode 024 on the base substrate 021. That is, the auxiliary electrode 023 and the first electrode 024 are insulated from each other.

It should be noted that the first electrode and the auxiliary electrode may be made from the same or different materials, and no matter the first electrode and the auxiliary electrode are made from the same or different materials, the auxiliary electrode and the first electrode may be formed in the manner of step 302 and step 303. When the first electrode and the auxiliary electrode are made from the same material, the auxiliary electrode and the first electrode may also be formed in manners other than the manner of step 302 and step 303. For example, the conductive material layer may be directly formed on the base substrate on which the control circuit layer is formed, and then the conductive material layer may be processed by a one-time patterning process to obtain the auxiliary electrode and the first electrode at the same time, which is not limited in the embodiments of the present disclosure.

In step 304, a mask is disposed on the side of the auxiliary electrode away from the base substrate, so that a target orthographic projection is located within the orthographic projection of the non-hollow area of the mask on the base substrate, and the orthographic projection of the first electrode on the base substrate at least partially overlaps the orthographic projection of the hollow area of the mask on the base substrate. The target orthographic projection includes the orthographic projection of the at least partial area of the auxiliary electrode on the base substrate.

Figure 7:
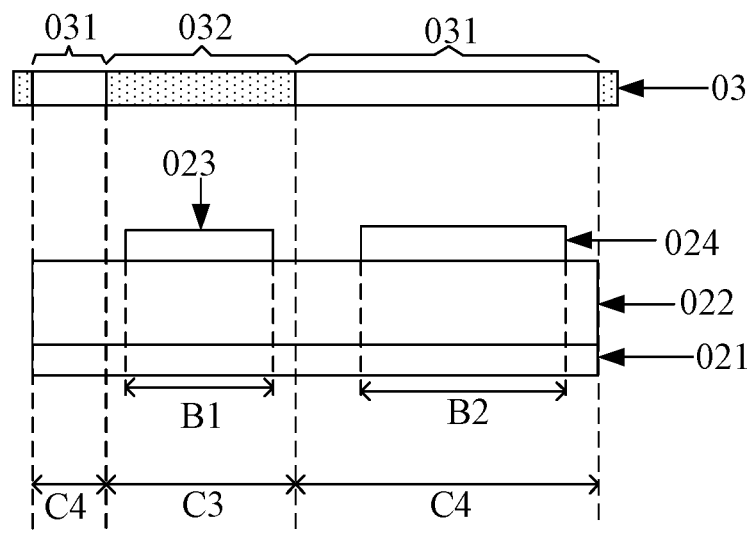
FIG. 7 is a schematic diagram showing a manufacturing process of a light-emitting component according to an embodiment of the present disclosure.

In the embodiment of the present disclosure, the mask is used to prepare the light-emitting component. As shown in FIG. 7, the mask 03 has a hollow area 031 and a non-hollow area 032. Optionally, the mask 03 may also include other non-hollow areas (not shown in FIG. 7) other than the hollow area 031 and the non-hollow area 032. For example, the mask 03 may be a Fine Metal Mask (FFM).

After the auxiliary electrode 023 and the first electrode 024 are formed, the mask 03 may be placed at a target position (where the mask as shown in FIG. 7 is located) on the side of the auxiliary electrode 023 away from the base substrate 021. In this case, the mask 03 may be suspended above the base substrate 021. Certainly, the mask 03 may also be located on the base substrate 021 on which the auxiliary electrode 023 and the first electrode 024 are formed.

When the mask is located at the target position, the target orthographic projection (the orthographic projection of the at least partial area of the auxiliary electrode on the base substrate) is located within the orthographic projection C3 of the non-hollow area 032 of the mask 03 on the base substrate 021. The orthographic projection (referred to as the second orthographic projection B2) of the first electrode 024 on the base substrate 021 at least partially overlaps the orthographic projection C4 of the hollow area 031 of the mask 03 on the base substrate 021. In the example shown in FIG. 7, the target orthographic projection is the entire orthographic projection (referred to as the first orthographic projection B1) of the auxiliary electrode 023 on the base substrate 021. Certainly, the target orthographic projection may also include only part of the first orthographic projection B1.

In the example shown in FIG. 7, the orthographic projection C3 surrounds the first orthographic projection B1, and the second orthographic projection B2 is located outside the orthographic projection C3. Optionally, the second orthographic projection B2 may not be located outside the orthographic projection C3 (e.g., the second orthographic projection B2 partially overlaps the orthographic projection C3).

In step 305, a light-emitting layer is deposited, through the hollow area of the mask, on the base substrate on which the auxiliary electrode and the first electrode are formed, from the side of the mask away from the base substrate. The light-emitting layer covers at least part of the first electrode, and the at least partial area of the auxiliary electrode is exposed outside the light-emitting layer.

Figure 8:
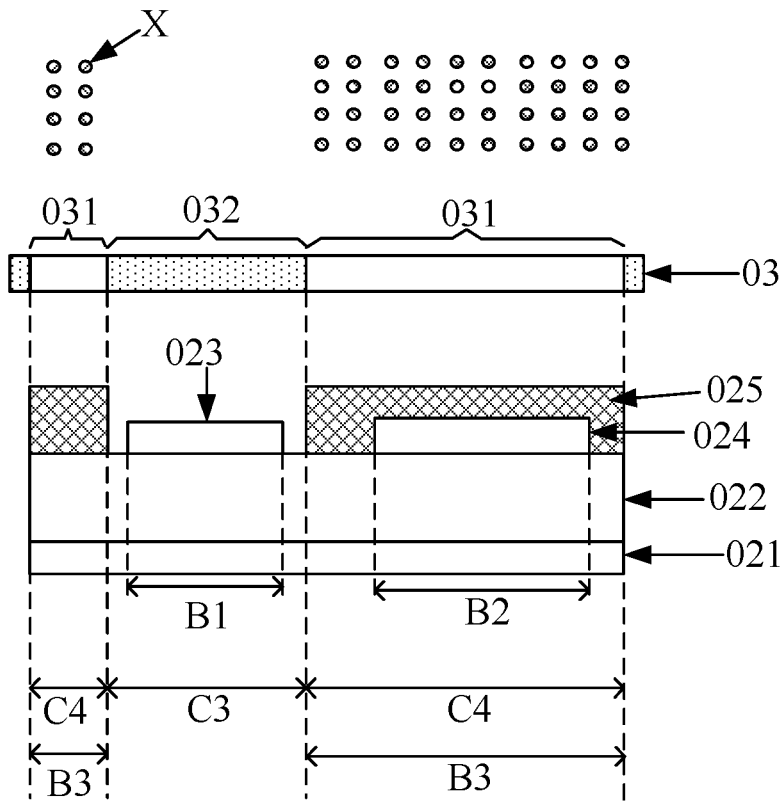
FIG. 8 is a schematic diagram showing a manufacturing process of a light-emitting component according to an embodiment of the present disclosure.

After the mask is placed at the target position on the side of the auxiliary electrode away from the base substrate, as shown in FIG. 8, a light-emitting material X may be deposited, through the hollow area 031 of the mask 03, on the base substrate 021 on which the auxiliary electrode 023 and the first electrode 024 are formed, from the side of the mask 03 away from the base substrate 021, so as to form a light-emitting layer 025 on the base substrate 021 on which the auxiliary electrode 023 and the first electrode 024 are formed. Exemplarily, the above-mentioned process of depositing the light-emitting material may be realized by means of evaporation, etc.

The deposited light-emitting layer 025 is in the same shape as the hollow area 031 in the mask 03, and thus the third orthographic projection B3 of the light-emitting layer 025 on the base substrate 021 and the orthographic projection C4 of the hollow area 031 of the mask 03 on the base substrate 021 are exactly the same. Therefore, the third orthographic projection B3 is located outside the target orthographic projection (the first orthographic projection B1 of the auxiliary electrode 023 on the base substrate 021 as shown in FIG. 7), and the second orthographic projection B2 of the first electrode 024 on the base substrate 021 at least partially overlaps the third orthographic projection B3. It thus can be seen that the light-emitting layer 025 covers at least part of the first electrode 024, and at least a partial area of the auxiliary electrode 023 is exposed outside the light-emitting layer 025. In the example shown in FIG. 8, the light-emitting layer 025 covers the whole first electrode 024, and the entire area of the auxiliary electrode 023 is exposed outside the light-emitting layer 025.

In addition, In the example shown in FIG. 8, the third orthographic projection B3 surrounds the first orthographic projection B1, and the second orthographic projection B2 is located within the third orthographic projection B3. Optionally, the second orthographic projection B2 may not be located within the third orthographic projection B3 (e.g., the second orthographic projection B2 partially overlaps the third orthographic projection B3). Optionally, the distance between the third orthographic projection B3 and the first orthographic projection B1 may be greater than zero, and in this case, the light-emitting layer is not in contact with the auxiliary electrode.

Optionally, the entire area of the auxiliary electrode may be exposed outside the light-emitting layer, and the distance between the orthographic projection of the auxiliary electrode on the base substrate and the orthographic projection of the light-emitting layer on the base substrate is greater than zero. Optionally, the light-emitting layer may surround the auxiliary electrode.

Step 306, a second electrode is formed on the base substrate on which the light-emitting layer is formed. The second electrode covers at least part of the light-emitting layer and the at least a partial area of the auxiliary electrode. The second electrode is connected to the at least partial area of the auxiliary electrode.

The second electrode may be a full surface electrode, covering all the areas of the base substrate. In this case, after the light-emitting layer is formed, a layer of conductive material may be formed, by means of coating, PVD, CVD or the like, on the base substrate on which the light-emitting layer is formed to obtain the second electrode.

Figure 9:
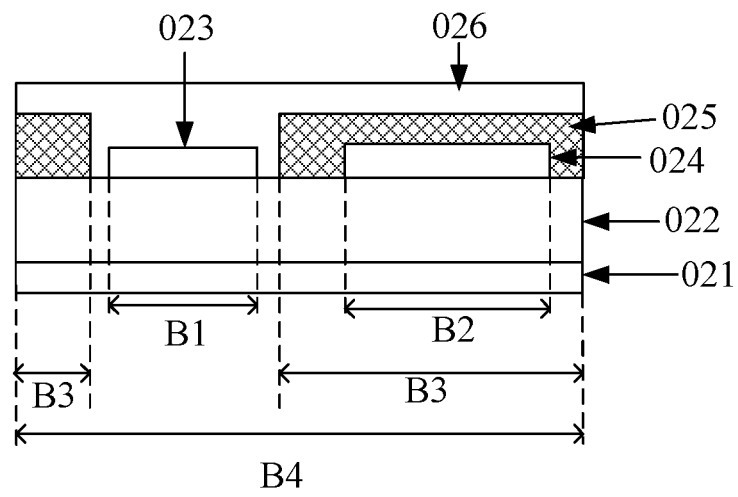
FIG. 9 is a schematic diagram showing a manufacturing process of a light-emitting component according to an embodiment of the present disclosure.

As shown in FIG. 9, the second electrode 026 covers at least part of the light-emitting layer 025 and the at least a partial area (the area of the auxiliary electrode 023 exposed to the light-emitting layer 025) of the auxiliary electrode 023. In the example shown in FIG. 9, the second electrode 026 covers the whole light-emitting layer 025 and the whole auxiliary electrode 023. The fourth orthographic projection B4 of the second electrode 026 on the base substrate 021 at least partially overlaps the target orthographic projection (e.g., the first orthographic projection B1 of the auxiliary electrode 023 on the base substrate 021). The fourth orthographic projection B4 of the second electrode 026 on the base substrate 021 at least partially overlaps the third orthographic projection B3 of the light-emitting layer 025 on the base substrate 021. It thus can be seen that the light-emitting layer 025 formed before step 306 does not cover the auxiliary electrode 023, and the second electrode 026 formed in step 306 can be in direct contact with the auxiliary electrode 023 and the light-emitting layer 025, thereby achieving the purpose of electrically connecting the second electrode 026 to the auxiliary electrode 023 and the light-emitting layer 025. In addition, since the second electrode 026 is electrically connected to the auxiliary electrode 023, the auxiliary electrode 023 can reduce the impedance on the second electrode 026.

It should be noted that in the example shown in FIG. 9, both the first orthographic projection B1 and the third orthographic projection B3 are within the fourth orthographic projection B4. Optionally, the first orthographic projection B1 and the third orthographic projection B3 may not both be within the fourth orthographic projection B4 (e.g., the third orthographic projection B3 may partially overlap the fourth orthographic projection B4).

After step 306, the light-emitting component can be obtained. The light-emitting layer in the light-emitting component can emit light under the action of a potential on the first electrode and a potential on the second electrode. The potential on the first electrode may be provided by the control circuit layer. The first electrode, the light-emitting layer and the second electrode may constitute an OLED, a Light Emitting Diode (LED) or other light-emitting elements, which is not limited in the embodiment of the present disclosure.

It should be noted that the manufactured light-emitting component in the embodiment of the present disclosure may be a top light-emitting component or a bottom light-emitting component, which is not limited in the embodiment of the present disclosure. When the light-emitting component is a top light-emitting component, the first electrode is light-tight and the second electrode is pervious to light (e.g., the first electrode is made from metal or graphene, and the second electrode is made from indium tin oxide or indium zinc oxide), the base substrate may be pervious to light or light-tight. In this case, the side, where the second electrode is located, of the light-emitting component emits light. When the light-emitting component is a bottom light-emitting component, the first electrode is pervious to light and the second electrode is light-tight (e.g., the first electrode is made from indium tin oxide or indium zinc oxide, and the second electrode is made from metal or graphene), and the base substrate is pervious to light. In this case, the side, where the first electrode is located, of the light-emitting component emits light. Optionally, both the first electrode and the second electrode may be pervious to light, which is not limited in the embodiment of the present disclosure.

In addition, the auxiliary electrode may be pervious to light or light-tight regardless of whether the light-emitting device is a top light-emitting component or a bottom light-emitting component. For example, the auxiliary electrode is made from metal (e.g., aluminum or copper), indium tin oxide or the like.

The embodiment of the present disclosure takes the manufactured light-emitting component as shown in FIG. 9 as an example for illustration. Optionally, the light-emitting component may be of a structure different from that shown in FIG. 9. For example, the manufactured light-emitting component may not include the control circuit layer. Under this circumstance, it is unnecessary to execute step 201, and the auxiliary electrode may be directly formed on the base substrate in step 202.

In summary, in the method for manufacturing the light-emitting component provided in the embodiment of the present disclosure, after the auxiliary electrode and the first electrode are formed on the base substrate, the light-emitting layer is deposited by using the mask and the light-emitting layer does not cover the at least partial area of the auxiliary electrode. Afterwards, the second electrode is formed to directly cover the at least partial area of the auxiliary electrode and at least part of the light-emitting layer, so that the second electrode is electrically connected to the auxiliary electrode. Since laser is not used in the method, no impurity particles will be adhered to the light-emitting layer, and thus the light-emitting effect of the light-emitting component will not be adversely affected by the impurity particles.

In addition, the efficiency of forming the light-emitting layer by using the mask is relatively high. Therefore, the efficiency of manufacturing the light-emitting component in the embodiment of the present disclosure is higher than that in the related art.

An embodiment of the present disclosure provides a light-emitting component, which may be manufactured by the method of manufacturing the light-emitting component provided in the embodiment of the present disclosure (the method shown in FIG. 2 or FIG. 3).

As shown in FIG. 9, the light-emitting component 02 includes a base substrate 021, an auxiliary electrode 023, a first electrode 024, a light-emitting layer 025 and a second electrode 026. The first electrode 024 and the auxiliary electrode 023 are arranged at an interval on the base substrate 021. Therefore, the first orthographic projection B1 of the auxiliary electrode 023 on the base substrate 021 is outside the second orthographic projection B2 of the first electrode 024 on the base substrate 021.

The light-emitting layer 025 is located on the side of the auxiliary electrode 023 away from the base substrate 021, and the light-emitting layer 025 covers at least part of the first electrode 024, and at least a partial area (e.g., the entire area) of the auxiliary electrode 023 is exposed outside the light-emitting layer 025. As shown in FIG. 9, the third orthographic projection B3 of the light-emitting layer 025 on the base substrate 021 is outside a target orthographic projection, and the second orthographic projection B2 and the third orthographic projection B3 are at least partially overlapping. The target orthographic projection includes at least part of the first orthographic projection B1. In the example shown in FIG. 9, the target orthographic projection includes the entire first orthographic projection B1.

The second electrode 026 is located on the side of the light-emitting layer 025 away from the base substrate 021, and the second electrode 026 covers at least part of the light-emitting layer 025 and the at least a partial area of the auxiliary electrode 023. The second electrode 026 is connected to the at least partial area of the auxiliary electrode 023. The fourth orthographic projection B4 of the second electrode 026 on the base substrate 021 at least partially overlaps the target orthographic projection (an orthographic projection of the at least partial area of the auxiliary electrode 023 on the base substrate), and the fourth orthographic projection B4 at least partially overlaps the third orthographic projection B3.

Optionally, continuing to refer to FIG. 9, the light-emitting component 02 may further include a control circuit layer 022 located on the base substrate 021, and the auxiliary electrode 023 and the first electrode 024 are arranged at an interval on the side of the control circuit layer 022 away from the base substrate 021. The first electrode 024 is electrically connected to the control circuit layer 022. Certainly, the light-emitting component 02 may not include the control circuit layer 022, which is not limited in the embodiment of the present disclosure.

Optionally, the entire area of the auxiliary electrode 023 may be exposed outside the light-emitting layer 025, and the distance between the orthographic projection of the auxiliary electrode 023 on the base substrate 021 and the orthographic projection of the light-emitting layer 025 on the base substrate 021 is greater than zero. Optionally, the light-emitting layer 025 may surround the auxiliary electrode 023. Optionally, at least one of the first electrode 024 and the second electrode 026 is pervious to light (e.g., the first electrode is pervious to light and the second electrode is light-tight, or the first electrode is light-tight and the second electrode is pervious to light, or both the first electrode and the second electrode are pervious to light).

An embodiment of the present disclosure further provides a mask, which may be used to prepare the light-emitting layer in the light-emitting component (the light-emitting component shown in FIG. 9) provided in the embodiment of the present disclosure. As shown in FIG. 8, the mask 03 has a hollow area 031 and a non-hollow area 032. The hollow area 031 has the same shape and area as the orthographic projection B3 of the light-emitting layer 025 prepared by the mask 03 on the base substrate 021 of the light-emitting component.

Optionally, the non-hollow area 032 in the mask may be rectangular, and the area of the non-hollow area 032 is larger than the area of a rectangle with a width of 15 microns and a length of 25 microns. For example, the area of the non-hollow area 032 is 1.5 to 2 times larger than the area of the rectangle.

Since the orthographic projections B3 of the hollow area 031 and the light-emitting layer 025 on the base substrate 021 have the same shape and area, when the mask 03 is located at a target position (e.g., the position where the mask as shown in FIG. 8 is located) on the side of the auxiliary electrode 023 away from the base substrate 021, the target orthographic projection (e.g., the first orthographic projection B1 of the auxiliary electrode 023 on the base substrate 021) is within the orthographic projection C3 of the non-hollow area 032 of the mask 03 on the base substrate 021, and the second orthographic projection B2 of the first electrode 024 on the base substrate 021 overlaps the orthographic projection C4 of the hollow area 031 of the mask 03 on the base substrate 021. In this way, the light-emitting layer may be deposited, through the hollow area of the mask, on the base substrate on which the auxiliary electrode and the first electrode are formed, from the side of the mask away from the base substrate, and the light-emitting layer covers at least part of the first electrode, and at least a partial area of the auxiliary electrode is exposed outside the light-emitting layer. After that, the second electrode formed on the base substrate on which the light-emitting layer is formed can cover at least part of the light-emitting layer and the at least partial area of the auxiliary electrode, so that the second electrode is electrically connected to the auxiliary electrode. No laser is used in the whole process. Therefore, no impurity particles are adhered to the light-emitting layer, and the light-emitting effect of the light-emitting component is not adversely affected by the impurity particles. In addition, the efficiency of forming the light-emitting layer by using the mask is relatively high. Therefore, the efficiency of manufacturing the light-emitting component in the embodiment of the present disclosure is higher than that in the related art.

The light-emitting component (the light-emitting component shown in FIG. 9) provided in the embodiment of the present disclosure may be a display substrate.

Figure 10:
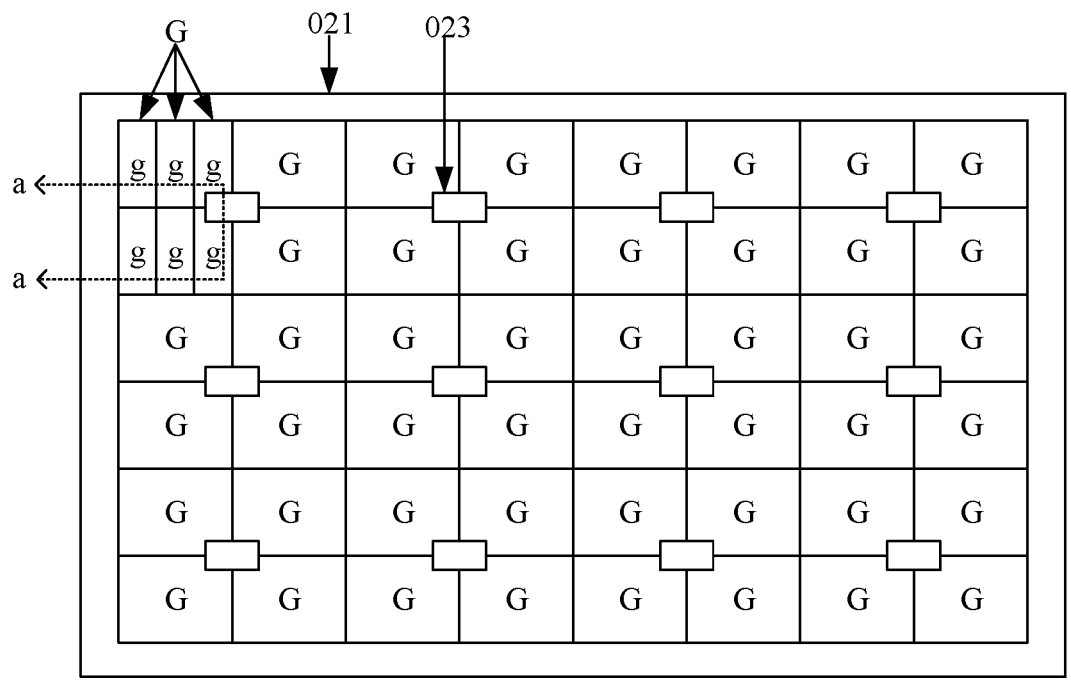
FIG. 10 is a schematic structural diagram of a light-emitting component according to an embodiment of the present disclosure.

Optionally, when the light-emitting component is a display substrate, as shown in FIG. 10, the light-emitting component includes a plurality of pixel structures G arranged in an array on the base substrate 021. The pixel structure G includes at least one sub-pixel structure g. In the example shown in FIG. 10, the pixel structure G includes three sub-pixel structures g. The three sub-pixel structures g may be sequentially arranged in a row direction of the pixel structure G and may include a sub-pixel structure configured to emit red light, a sub-pixel structure configured to emit green light, and a sub-pixel structure configured to emit blue light.

FIG. 9 shows the structure of a section aa in FIG. 10. With reference to FIG. 9 and FIG. 10, each sub-pixel structure g includes the first electrode, the light-emitting layer and the second electrode. The first electrode, the light-emitting layer and the second electrode in each sub-pixel structure g are sequentially superimposed in a direction away from the base substrate, and all the second electrodes in the plurality of pixel structures are connected.

With continue reference to FIG. 10. In the plurality of pixel structures G arranged in an array, one auxiliary electrode 023 is arranged among an $i^{th}$-row $j^{th}$-column pixel structure, an $i^{th}$-row $(j+1)^{th}$-column pixel structure, an $(i+1)^{th}$-row $j^{th}$-column pixel structure and an $(i+1)^{th}$-row $(j+1)^{th}$-column pixel structure, where i is greater than or equal to 1, and j is an odd number. For example, one auxiliary electrode 023 is arranged among a first-row first-column pixel structure, a first-row second-column pixel structure, a second-row first-column pixel structure, and a second-row second-column pixel structure; and one auxiliary electrode 023 is arranged among a first-row third-column pixel structure, a first-row fourth-column pixel structure, a second-row third-column pixel structure, and a second-row fourth-column pixel structure. Certainly, the auxiliary electrode 023 may be arranged in a position different from that shown in FIG. 10 on the base substrate, which is not limited in the embodiment of the present disclosure.

It should be noted that in the example shown in FIG. 10, the light-emitting component includes 6 rows and 8 columns of pixel structures. Optionally, the number of rows and the number of columns of the pixel structures in the light-emitting component may also be other values. For example, the light-emitting component includes 4,320 rows and 7,360 columns of pixel structures, which is not limited in the embodiment of the present disclosure.

Figure 11:
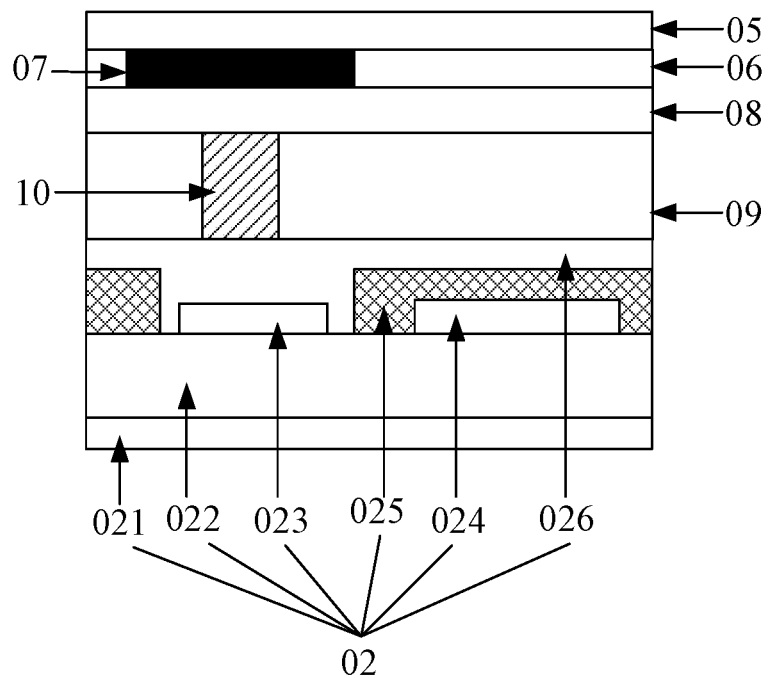
FIG. 11 is a schematic structural diagram of a display device according to an embodiment of the present disclosure.

FIG. 11 is a schematic structural diagram of a display device according to an embodiment of the present disclosure. As shown in FIG. 11, the display device 04 may include the light-emitting component provided in the embodiments of the present disclosure. In the example shown in FIG. 11, the light-emitting component is the light-emitting component shown in FIG. 9.

Optionally, the display device 04 may also include a cover plate 05. The cover plate 05 may be disposed opposite to the base substrate 021 in the light-emitting component 02. Other structures, other than the base substrate 021, in the light-emitting component 02 are disposed between the base substrate 021 and the cover plate 05.

Optionally, the display device 04 may further include a color resisting layer (including a color film 06 and a black matrix 07) on the side of the cover plate 05 facing the base substrate 021. In this case, light emitted from the light-emitting component 02 may be white light. When the display device 04 does not include the color film 06, the light emitted from the light-emitting component 02 may be white light or colored light.

Optionally, the display device may further include an upper covering layer 08 disposed on the side of the color film 06 facing the base substrate 021. Optionally, the display device may further include a filling layer 09, a support pillar 10 and a sealant (not shown in FIG. 11) which are disposed between the upper covering layer 08 and the light-emitting component 02.

During manufacture of the display device shown in FIG. 11, the method of manufacturing the light-emitting component provided in the embodiments of the present disclosure may be used to prepare the light-emitting component, so as to obtain a display substrate. A color film, a black matrix and an upper covering layer may also be formed on the cover plate. After that, a filling layer, a support pillar and a sealant are formed on the side, where the second electrode is disposed, of the display substrate, and then the cover plate provided with the color film, the black matrix and the upper covering layer is aligned with the display substrate to form a box.

In addition, the display device provided in the embodiment of the present disclosure may be any product or component having a display function, such as a display panel (e.g., an OLED display panel or an LED display panel), a piece of electronic paper, a mobile phone, a tablet computer, a television, a display, a laptop, a digital phone frame, or a navigator.

The display device provided in the embodiment of the present disclosure may be a large-sized (e.g., greater than 30 to 40 inches) or a small-sized (e.g., less than or equal to 30 inches) display device.

It should be noted that in the accompanying drawings, for clarity of the illustration, the dimension of the layers and areas may be scaled up. It is to be understood that when an element or a layer is described as being "on" another element or layer, the described element or layer may be directly on the other element or layer, or at least one intermediate layer may be arranged between the described element or layer and the other element or layer. In addition, it is to be understood that when an element or a layer is described as being "under" another element or layer, the described element or layer may be directly under the other element or layer, or at least one intermediate layer may be arranged between the described element or layer and the other element or layer. In addition, it is to be further understood that when a layer or an element is described as being "between" two layers or elements, the described layer or element may be the only layer between the two layers or elements, or at least one intermediate layer or element may be arranged between the described element or layer and the two layers or elements. In the whole description described above, the similar reference numerals denote similar elements.

In the present disclosure, the terms "first", "second", "third" and "fourth" are used for descriptive purposes only, and are not to be construed as indicating or implying a relative importance. The term "plurality" herein refers to two or more, unless otherwise specified.

It should be noted that the method embodiments and the corresponding light-emitting component embodiments of the present disclosure may be cross referenced, which is not limited in the embodiments of the present disclosure. The sequence of the steps in the method embodiments may be adjusted appropriately, and the steps may be removed or added depending on circumstances. Within the technical scope disclosed in the present disclosure, any variations of the method easily derived by a person of ordinary skill in the art shall fall within the protection scope of the present disclosure, which is not be repeated herein.

The foregoing descriptions are merely optional embodiments of the present disclosure, and are not intended to limit the present disclosure. Within the spirit and principles of the present disclosure, any modifications, equivalent substitutions, improvements, etc., shall be included within the protection scope of the present disclosure.

What is claimed is:

1. A method for manufacturing a light-emitting component, comprising:
    forming an auxiliary electrode and a first electrode arranged at an interval on a base substrate;
    depositing, by a mask with a hollow area, a light-emitting layer on the base substrate on which the auxiliary electrode and the first electrode are formed, wherein the light-emitting layer covers a whole first electrode, and at least a partial area of the auxiliary electrode is exposed outside the light-emitting layer; and
    forming a second electrode on the base substrate on which the light-emitting layer is formed, wherein the second electrode covers at least part of the light-emitting layer and the at least partial area of the auxiliary electrode, and the second electrode is connected to the at least partial area of the auxiliary electrode; and
    wherein the light-emitting layer is in direct contact with a lateral surface of the first electrode, and both a lateral surface of the auxiliary electrode and a lateral surface of the light-emitting layer are in direct contact with the second electrode.

2. The method according to claim 1, wherein the mask comprises the hollow area and a non-hollow area, and depositing, by means of the mask with the hollow area, the light-emitting layer on the base substrate on which the auxiliary electrode and the first electrode are formed comprises:
    disposing the mask on a side of the auxiliary electrode away from the base substrate, so that an orthographic projection of the at least partial area on the base substrate is within an orthographic projection of the non-hollow area on the base substrate, and an orthographic projection of the first electrode on the base substrate at least partially overlaps an orthographic projection of the hollow area on the base substrate; and
    depositing, through the hollow area of the mask, the light-emitting layer on the base substrate on which the auxiliary electrode and the first electrode are formed, from a side of the mask away from the base substrate.

3. The method according to claim 1, wherein the light-emitting component meets at least one of the following conditions:
    an entire area of the auxiliary electrode is exposed outside the light-emitting layer, and a distance between an orthographic projection of the auxiliary electrode on the base substrate and an orthographic projection of the light-emitting layer on the base substrate is greater than zero; and the light-emitting layer surrounds the auxiliary electrode.

4. The method according to claim 1, wherein at least one of the first electrode and the second electrode is pervious to light.

5. The method according to claim 1, wherein the mask is a fine metal mask.

6. The method according to claim 1, wherein forming the auxiliary electrode and the first electrode on the base substrate comprises:

sequentially forming the auxiliary electrode and the first electrode on the base substrate.

7. The method according to claim 1, wherein before forming the auxiliary electrode and the first electrode on the base substrate, the method further comprises:

forming a control circuit layer on the base substrate; and forming the auxiliary electrode and the first electrode on the base substrate comprises: forming the auxiliary electrode and the first electrode on the base substrate on which the control circuit layer is formed, wherein the first electrode is electrically connected to the control circuit layer.

8. A light-emitting component, comprising: a base substrate, an auxiliary electrode, a first electrode, a light-emitting layer and a second electrode, wherein the first electrode and the auxiliary electrode are arranged at an interval on the base substrate;

the light-emitting layer is located on a side of the auxiliary electrode away from the base substrate and covers a whole first electrode, and at least a partial area of the auxiliary electrode is exposed outside the light-emitting layer;

the second electrode is located on a side of the light-emitting layer away from the base substrate, covers at least part of the light-emitting layer and the at least partial area of the auxiliary electrode, and is connected to the at least partial area of the auxiliary electrode; and the light-emitting layer is in direct contact with a lateral surface of the first electrode, and both a lateral surface of the auxiliary electrode and a lateral surface of the light-emitting layer are in direct contact with the second electrode.

9. The light-emitting component according to claim 8, wherein the light-emitting component meets at least one of the following conditions:

an entire area of the auxiliary electrode is exposed outside the light-emitting layer, and a distance between an orthographic projection of the auxiliary electrode on the base substrate and an orthographic projection of the light-emitting layer on the base substrate is greater than zero; and the light-emitting layer surrounds the auxiliary electrode.

10. The light-emitting component according to claim 8, wherein at least one of the first electrode and the second electrode is pervious to light.

11. The light-emitting component according to claim 8, further comprising: a control circuit layer, wherein the control circuit layer is located on the base substrate, the auxiliary electrode and the first electrode are arranged at an interval on a side of the control circuit layer away from the base substrate, and the first electrode is electrically connected to the control circuit layer.

12. The light-emitting component according to claim 8, wherein the light-emitting component is a display substrate.

13. The light-emitting component according to claim 12, comprising: a plurality of pixel structures arranged in an array on the base substrate, wherein the pixel structure comprises at least one sub-pixel structure, the sub-pixel structure comprises the first electrode, the light-emitting layer and the second electrode, and the second electrodes in the plurality of pixel structures are connected to each other; and one auxiliary electrode is arranged among an $i^{th}$-row $j^{th}$-column pixel structure, an $i^{th}$-row $(j+1)^{th}$-column pixel structure, an $(i+1)^{th}$-row $j^{th}$-column pixel structure and an $(i+1)^{th}$-row $(j+1)^{th}$-column pixel structure, where i is greater than or equal to 1, and j is an odd number.

14. A mask, wherein the mask is configured to prepare the light-emitting layer in the light-emitting component according to claim 8 and comprises a hollow area, and orthographic projections of the hollow area and the light-emitting layer on the base substrate in the light-emitting component are the same in shape and area.

15. A display device, comprising the light-emitting component according to claim 8.

16. The display device according to claim 15, further comprising a cover plate arranged opposite to a base substrate in the light-emitting component, wherein structures, other than the base substrate, in the light-emitting component are located between the base substrate and the cover plate.

17. The display device according to claim 16, wherein the display device further comprises a color resisting layer located between the cover plate and the light-emitting component.

* * * * *